(12) United States Patent
Grantham

(10) Patent No.: US 12,302,527 B2
(45) Date of Patent: May 13, 2025

(54) ELECTRONIC EQUIPMENT ENCLOSURE WITH ENHANCED MOUNTING FLEXIBILITY

(71) Applicant: Vertiv Corporation, Columbus, OH (US)

(72) Inventor: Roy L. Grantham, O'Fallen, MO (US)

(73) Assignee: Vertiv Corporation, Westerville, OH (US)

( * ) Notice: Subject to any disclaimer, the term of this patent is extended or adjusted under 35 U.S.C. 154(b) by 147 days.

(21) Appl. No.: 17/901,539

(22) Filed: Sep. 1, 2022

(65) Prior Publication Data
US 2023/0073519 A1 Mar. 9, 2023

Related U.S. Application Data

(60) Provisional application No. 63/241,901, filed on Sep. 8, 2021.

(51) Int. Cl.
*H05K 7/18* (2006.01)
*H05K 7/14* (2006.01)

(52) U.S. Cl.
CPC ............. *H05K 7/18* (2013.01); *H05K 7/1492* (2013.01)

(58) Field of Classification Search
CPC ....... H05K 7/18; H05K 7/1492; H05K 7/1488
See application file for complete search history.

(56) References Cited

U.S. PATENT DOCUMENTS

| | | | | |
|---|---|---|---|---|
| 4,691,483 A | * | 9/1987 | Anderson | E04H 9/10 49/400 |
| 4,699,270 A | * | 10/1987 | Bohm | H05K 5/0021 220/532 |
| 5,193,683 A | * | 3/1993 | Key | B65D 5/14 206/503 |
| 5,593,219 A | * | 1/1997 | Ho | G06F 1/181 312/265.5 |
| 5,944,398 A | * | 8/1999 | Wu | H05K 7/18 312/265.3 |

(Continued)

FOREIGN PATENT DOCUMENTS

| | | | | |
|---|---|---|---|---|
| CA | 2277604 C | * | 6/2007 | ......... G09F 13/0413 |
| EP | 0132152 A2 | * | 1/1985 | |

(Continued)

OTHER PUBLICATIONS

PCT Application No. PCT/US2022/042404 International Search Report dated Dec. 20, 2022.

*Primary Examiner* — Hanh V Tran
(74) *Attorney, Agent, or Firm* — Mackey Law Firm PLLC

(57) ABSTRACT

An electronic equipment enclosure comprising a frame, the frame defining a top, a bottom, two sides, a front, and a rear thereof; a rack mounted within the frame, the rack defining a rack volume therewithin; and a panel assembly mounted on the frame, the panel assembly including a top panel, a bottom panel, at least one side panel, and at least one opening door. The enclosure can include a utility space configured to receive a power unit therein. The utility space can be defined by the frame between the panel assembly and the rack volume such that the power unit does not extend beyond the panel assembly or into the rack volume. Both sides, the top, and the bottom of the frame can include mounts configured to allow the enclosure to be mounted or supported.

20 Claims, 16 Drawing Sheets

(56) References Cited

U.S. PATENT DOCUMENTS

| | | | |
|---|---|---|---|
| 5,964,513 A * | 10/1999 | Korinsky | G06F 1/181 312/265.5 |
| 6,050,013 A * | 4/2000 | Heaton | G09F 13/04 40/574 |
| 6,561,603 B2 | 5/2003 | Knab et al. | |
| 6,634,512 B2 | 10/2003 | Knab et al. | |
| 6,945,616 B2 | 9/2005 | Webster et al. | |
| 8,403,431 B2 * | 3/2013 | Elkins | H04Q 1/11 312/265.3 |
| 8,599,540 B2 | 12/2013 | Fernandez | |
| 9,578,772 B2 | 2/2017 | Podemski et al. | |
| 9,763,338 B2 | 9/2017 | Hacking | |
| 10,135,268 B1 * | 11/2018 | Gokcebay | H02J 7/0013 |
| 10,179,598 B1 * | 1/2019 | Goodbinder | H05K 5/0234 |
| 11,547,011 B2 * | 1/2023 | Teeter | H05K 7/1492 |
| 2004/0183409 A1 * | 9/2004 | Rinderer | H05K 7/1421 312/265.4 |
| 2005/0259383 A1 * | 11/2005 | Ewing | H02B 1/306 361/622 |
| 2014/0160637 A1 * | 6/2014 | Liu | H05K 7/1492 361/622 |
| 2015/0351267 A1 | 12/2015 | Shah et al. | |
| 2016/0073525 A1 | 3/2016 | Maloney et al. | |
| 2017/0127568 A1 * | 5/2017 | Rimler | H05K 7/1488 |
| 2017/0280580 A1 * | 9/2017 | Nguyen | H05K 7/186 |
| 2018/0205247 A1 * | 7/2018 | Maguire | A47B 96/1408 |
| 2019/0047424 A1 * | 2/2019 | Takahashi | H05K 5/0204 |
| 2019/0116972 A1 * | 4/2019 | Tao | A47B 47/0083 |
| 2019/0320796 A1 * | 10/2019 | Ding | H05K 7/1488 |
| 2020/0137917 A1 * | 4/2020 | Bold | H05K 7/1489 |
| 2020/0267853 A1 | 8/2020 | Merrell et al. | |
| 2020/0323099 A1 * | 10/2020 | Dickow | G01M 15/02 |
| 2021/0383784 A1 * | 12/2021 | Leatherdale | G10K 11/168 |
| 2022/0007523 A1 * | 1/2022 | Hubble, Jr. | H05K 5/061 |
| 2022/0078954 A1 * | 3/2022 | Scott | H05K 9/0009 |

FOREIGN PATENT DOCUMENTS

| | | | | |
|---|---|---|---|---|
| EP | 1152506 A2 | 11/2001 | | |
| EP | 1152507 A2 | 11/2001 | | |
| EP | 2559120 A1 | 2/2013 | | |
| EP | 3429218 B1 * | 4/2020 | | H04Q 1/025 |
| EP | 3855587 A1 | 7/2021 | | |
| WO | WO-2014070176 A1 * | 5/2014 | | H05K 7/14 |
| WO | WO-2017072946 A1 * | 5/2017 | | H05K 7/1432 |
| WO | WO-2021154161 A1 * | 8/2021 | | H05K 5/0226 |
| WO | 2023038850 A1 | 3/2023 | | |

* cited by examiner

ELECTRONIC EQUIPMENT ENCLOSURE WITH ENHANCED MOUNTING FLEXIBILITY

CROSS REFERENCE TO RELATED APPLICATIONS

This application claims the benefit of U.S. Provisional Patent Application No. 63/241,901 filed Sep. 8, 2021, the entire contents of which are incorporated herein by reference.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The present disclosure relates generally to electronic equipment enclosures and more specifically relates to electronic equipment enclosures with mounting flexibility.

Description of the Related Art

Edge computing is information processing at or near the source of data instead of relying on the cloud or one or more data centers. In many edge computing locations, available space is limited. Current wall mount racks on the market today generally range from 6U to 24U in height, in a horizontal U-orientation. There are some offered with a vertical U-orientation in 3U to 6U widths.

Additionally, some currently available wall mount racks are available in a few depths so that they can accommodate IT equipment such as switches, servers, uninterruptible power supply (UPS) units, etc. However, additional wall space or internal cabinet U-space is often occupied by UPS or power distribution unit (PDU) equipment.

BRIEF SUMMARY OF THE INVENTION

Applicants have created new and useful devices, systems and methods for electronic equipment enclosures.

In at least one embodiment, an electronic equipment enclosure can comprise a frame assembly, a rack assembly mounted within the frame assembly, a panel assembly mounted on the frame assembly, and a utility space to contain a power unit therein. In at least one embodiment, the frame assembly can define a top, a bottom, two sides, a front, and a rear thereof. In at least one embodiment, the rack assembly can define a rack volume therewithin. In at least one embodiment, the rack assembly comprises four identical equipment rails. In at least one embodiment, the panel assembly can include a top panel, a bottom panel, one or more side panels, and one or more opening doors. In at least one embodiment, the utility space can be defined by the frame assembly between the panel assembly and the rack volume such that the power unit does not extend beyond the panel assembly or into the rack volume.

In at least one embodiment, the rack volume comprises rack units, or U space, which houses IT equipment such as switches, servers, etc., or other equipment. Having the power unit located within the utility space, and not in the rack volume, means that the power unit does not need to occupy the rack volume (rack units or U space), thereby maximizing the available rack volume.

In at least one embodiment, each side of the frame assembly can include one or more mounts configured to allow the enclosure to be mounted to a wall along both of the sides. In at least one embodiment, the top of the frame assembly can include one or more mounts configured to allow the enclosure to be mounted overhead, such as to a ceiling or otherwise. In at least one embodiment, the bottom of the frame assembly can include one or more mounts configured to allow the enclosure to be mounted to or otherwise supported on a floor or other structure beneath the enclosure.

In at least one embodiment, the frame assembly comprises four identical vertical posts, four identical lateral horizontal rails, and four identical longitudinal horizontal rails. In at least one embodiment, each of the four identical vertical posts of the frame assembly can include one or more hinge mounting positions configured to receive hinges of the door, such that the door can be mounted to the front of the frame assembly or the rear of the frame assembly, and such that the door can be mounted to open toward a left side of the frame assembly or a right side of the frame assembly.

In at least one embodiment, the top panel and the bottom panel can be secured to the frame assembly with a plurality of fasteners. In at least one embodiment, the side panel can be held adjacent to the frame assembly by the top panel and the bottom panel, without fasteners. In at least one embodiment, the side panel can also be held adjacent to the frame assembly by the door, such that the side panel can be removed from the enclosure when the door is open without tools.

In at least one embodiment, an electronic equipment enclosure can comprise a frame assembly, a rack assembly mounted within the frame assembly, and a panel assembly mounted on the frame assembly. In at least one embodiment, each side of the frame assembly can include one or more mounts configured to allow the enclosure to be mounted to a wall along both of the sides. In at least one embodiment, the top of the frame assembly can include one or more mounts configured to allow the enclosure to be mounted overhead. In at least one embodiment, the bottom of the frame assembly can include one or more mounts configured to allow the enclosure to be mounted to or otherwise supported on a floor or other structure beneath the enclosure.

In at least one embodiment, the frame assembly can define a top, a bottom, two sides, a front, and a rear thereof. In at least one embodiment, the rack assembly can define a rack volume therewithin. In at least one embodiment, the rack assembly comprises four identical equipment rails. In at least one embodiment, the panel assembly can include a top panel, a bottom panel, one or more side panels, and one or more opening doors.

In at least one embodiment, a utility space contains a power unit therein. In at least one embodiment, the utility space can be defined by the frame assembly between the panel assembly and the rack volume such that the power unit does not extend beyond the panel assembly or into the rack volume.

In at least one embodiment, the frame assembly comprises four identical vertical posts, four identical lateral horizontal rails, and four identical longitudinal horizontal rails. In at least one embodiment, each of the four identical vertical posts of the frame assembly can include one or more hinge mounting positions configured to receive hinges of the door, such that the door can be mounted to the front of the frame assembly or the rear of the frame assembly, and such that the door can be mounted to open toward a left side of the frame assembly or a right side of the frame assembly.

In at least one embodiment, the top panel and the bottom panel can be secured to the frame assembly with a plurality of fasteners. In at least one embodiment, the side panel can be held adjacent to the frame assembly by the top panel and the bottom panel, without fasteners. In at least one embodiment, the side panel can also be held adjacent to the frame assembly by the door, such that the side panel can be removed from the enclosure when the door is open without tools.

DETAILED DESCRIPTION OF THE INVENTION

Figure 1:
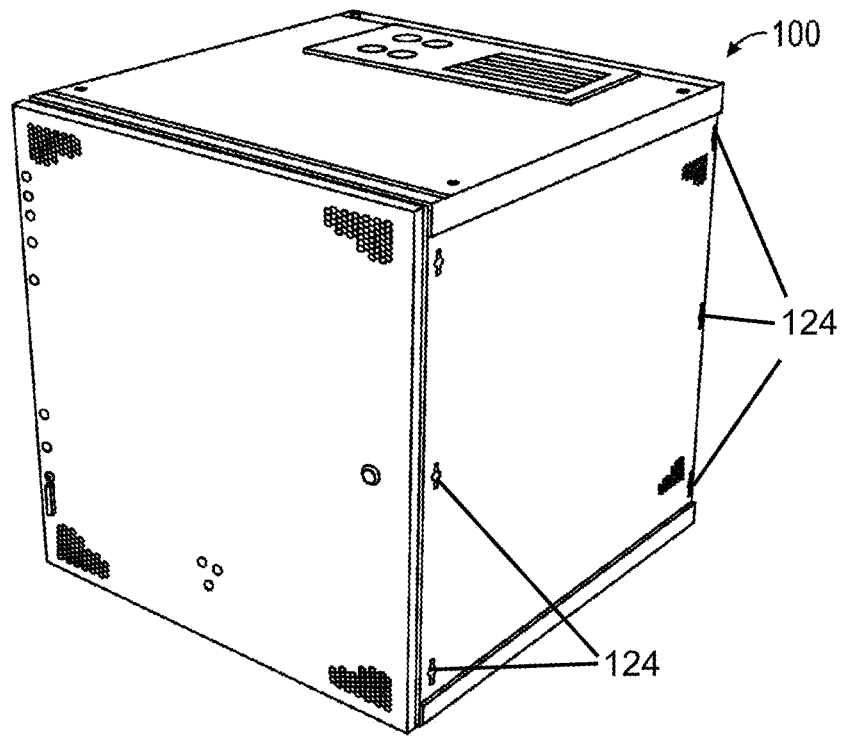
FIG. 1 is a front perspective view of one of many embodiments of an electronic equipment enclosure according to the disclosure.

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others. As used herein, the term "identical" means "at least substantially identical" and, thus, includes both substantial identicality and actual identicality unless expressly indicated otherwise.

Applicants have created new and useful devices, systems and methods for electronic equipment enclosures.

In at least one embodiment, an electronic equipment enclosure can comprise a frame assembly, a rack assembly mounted within the frame assembly, a panel assembly mounted on the frame assembly, and a utility space to contain a power unit therein. In at least one embodiment, the frame assembly can define a top, a bottom, two sides, a front, and a rear thereof. In at least one embodiment, the rack assembly can define a rack volume therewithin. In at least one embodiment, the rack assembly comprises four identical equipment rails. In at least one embodiment, the panel assembly can include a top panel, a bottom panel, one or more side panels, and one or more opening doors. In at least one embodiment, the utility space can be defined by the frame assembly between the panel assembly and the rack volume such that the power unit does not extend beyond the panel assembly or into the rack volume.

In at least one embodiment, the rack volume comprises rack units, or U space, which houses IT equipment such as switches, servers, etc., or other equipment. Having the power unit located within the utility space, and not in the rack volume, means that the power unit does not need to occupy the rack volume (rack units or U space), thereby maximizing the available rack volume.

In at least one embodiment, each side of the frame assembly can include one or more mounts configured to allow the enclosure to be mounted to a wall along both of the sides. In at least one embodiment, the top of the frame assembly can include one or more mounts configured to allow the enclosure to be mounted overhead, such as to a ceiling or otherwise. In at least one embodiment, the bottom of the frame assembly can include one or more mounts configured to allow the enclosure to be mounted to or otherwise supported on a floor or other structure beneath the enclosure.

In at least one embodiment, the frame assembly comprises four identical vertical posts, four identical lateral horizontal rails, and four identical longitudinal horizontal rails. In at least one embodiment, each of the four identical vertical posts of the frame assembly can include one or more hinge mounting positions configured to receive hinges of the door, such that the door can be mounted to the front of the frame assembly or the rear of the frame assembly, and such that the door can be mounted to open toward a left side of the frame assembly or a right side of the frame assembly.

In at least one embodiment, the top panel and the bottom panel can be secured to the frame assembly with a plurality of fasteners. In at least one embodiment, the side panel can be held adjacent to the frame assembly by the top panel and the bottom panel, without fasteners. In at least one embodiment, the side panel can also be held adjacent to the frame assembly by the door, such that the side panel can be removed from the enclosure when the door is open without tools.

In at least one embodiment, an electronic equipment enclosure can comprise a frame assembly, a rack assembly mounted within the frame assembly, and a panel assembly mounted on the frame assembly. In at least one embodiment, each side of the frame assembly can include one or more mounts configured to allow the enclosure to be mounted to a wall along both of the sides. In at least one embodiment, the top of the frame assembly can include one or more mounts configured to allow the enclosure to be mounted overhead. In at least one embodiment, the bottom of the frame assembly can include one or more mounts configured to allow the enclosure to be mounted to or otherwise supported on a floor or other structure beneath the enclosure.

In at least one embodiment, the frame assembly can define a top, a bottom, two sides, a front, and a rear thereof. In at least one embodiment, the rack assembly can define a rack volume therewithin. In at least one embodiment, the rack assembly comprises four identical equipment rails. In at least one embodiment, the panel assembly can include a top panel, a bottom panel, one or more side panels, and one or more opening doors.

In at least one embodiment, a utility space contains a power unit therein. In at least one embodiment, the utility space can be defined by the frame assembly between the panel assembly and the rack volume such that the power unit does not extend beyond the panel assembly or into the rack volume.

In at least one embodiment, the frame assembly comprises four identical vertical posts, four identical lateral horizontal rails, and four identical longitudinal horizontal rails. In at least one embodiment, each of the four identical vertical posts of the frame assembly can include one or more hinge mounting positions configured to receive hinges of the door, such that the door can be mounted to the front of the frame assembly or the rear of the frame assembly, and such that the door can be mounted to open toward a left side of the frame assembly or a right side of the frame assembly.

In at least one embodiment, the top panel and the bottom panel can be secured to the frame assembly with a plurality of fasteners. In at least one embodiment, the side panel can be held adjacent to the frame assembly by the top panel and the bottom panel, without fasteners. In at least one embodiment, the side panel can also be held adjacent to the frame assembly by the door, such that the side panel can be removed from the enclosure when the door is open without tools.

Figure 2:
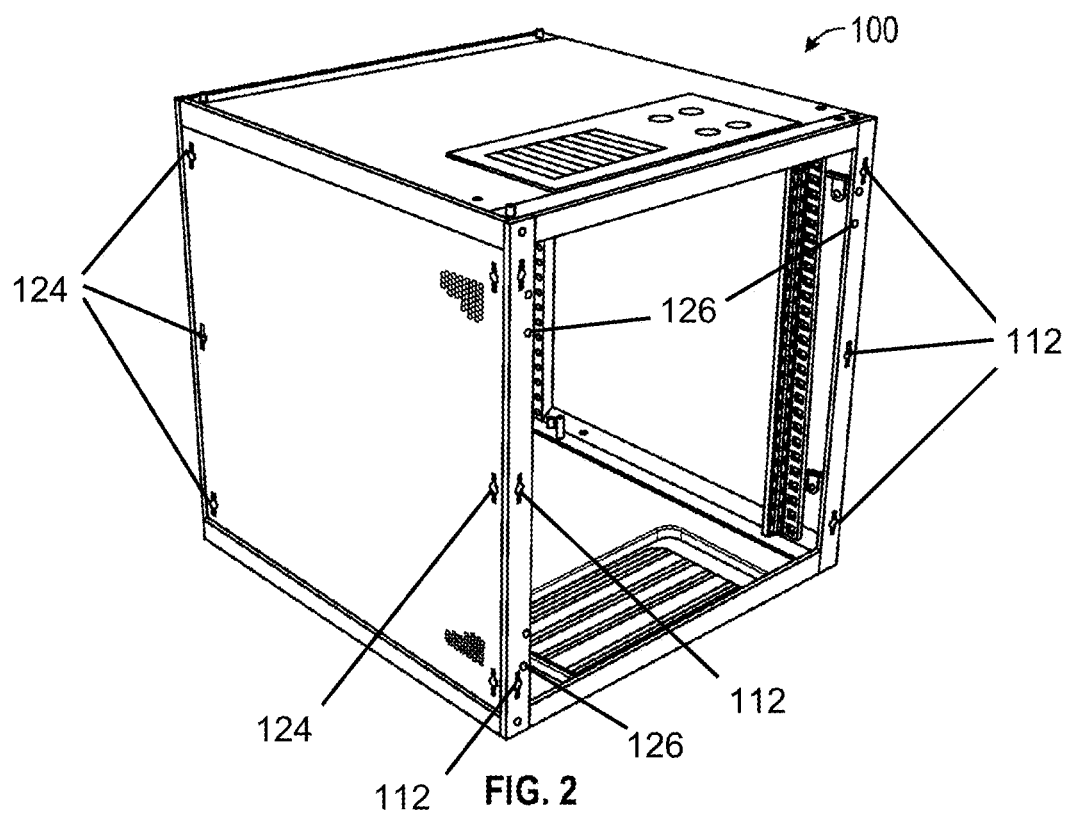
FIG. 2 is a rear perspective view of one of many embodiments of an electronic equipment enclosure according to the disclosure.
Figure 3:
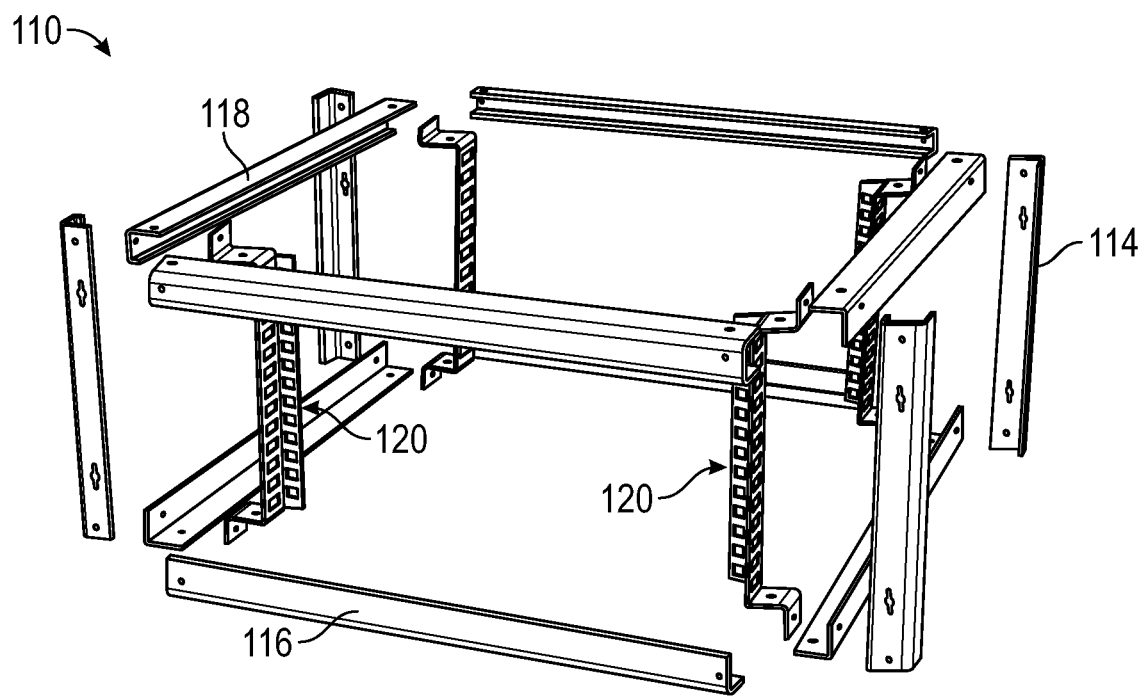
FIG. 3 is an exploded perspective view of one of many embodiments of a frame subassembly of an electronic equipment enclosure according to the disclosure.
Figure 4:
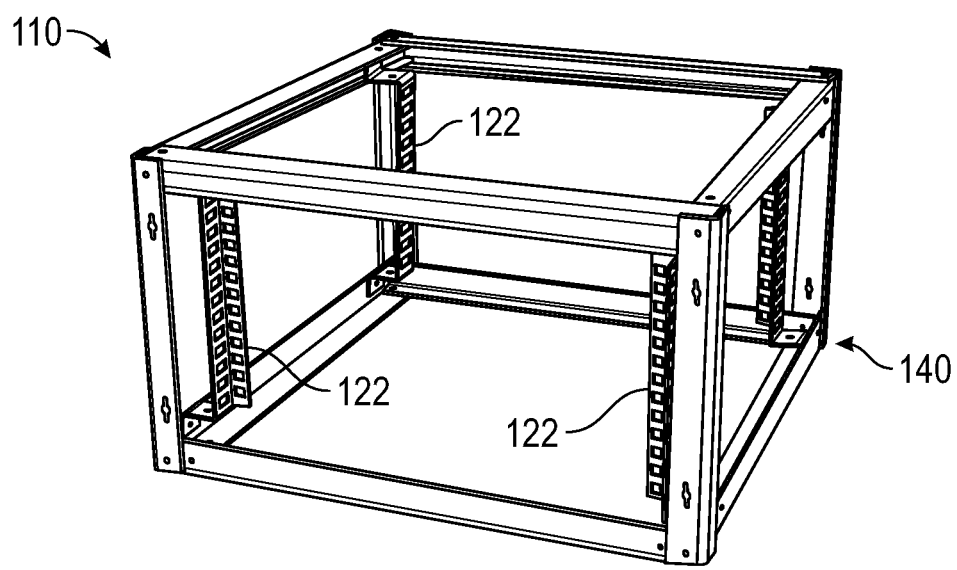
FIG. 4 is a perspective view of one of many embodiments of a frame subassembly of an electronic equipment enclosure according to the disclosure.
Figure 5:
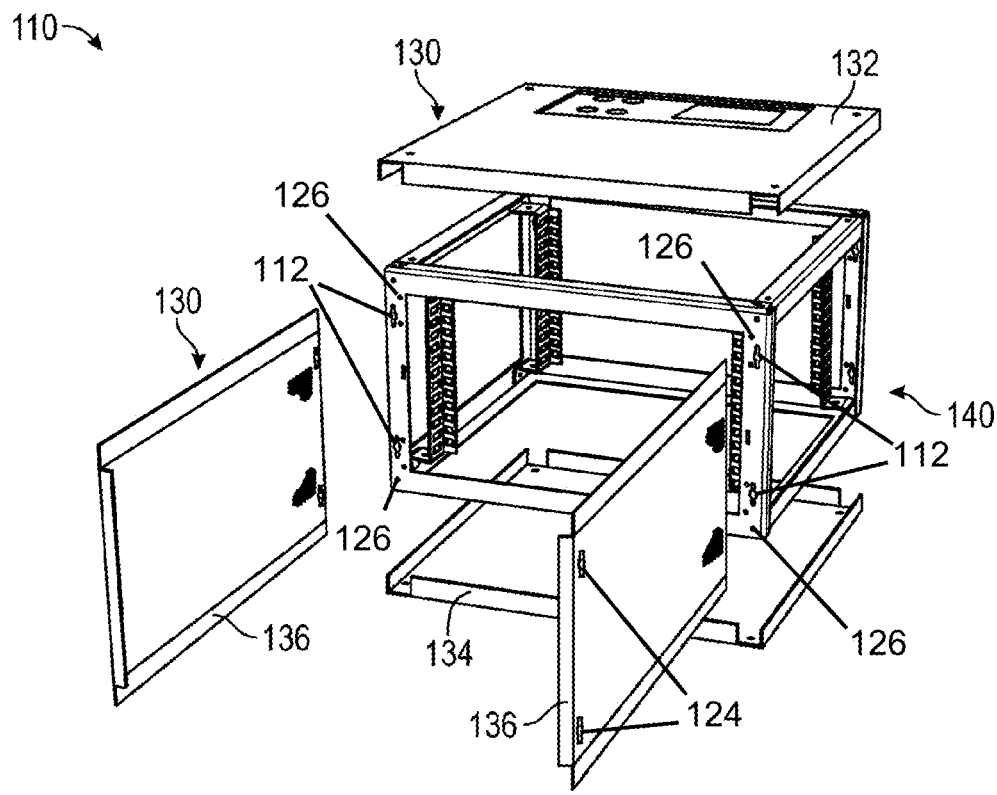
FIG. 5 is an exploded perspective view of one of many embodiments of a panel subassembly of an electronic equipment enclosure according to the disclosure.
Figure 6:
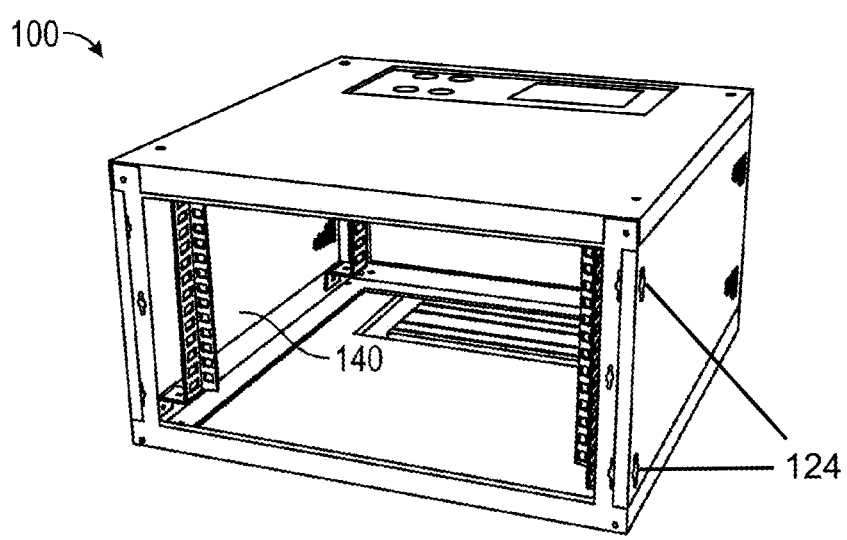
FIG. 6 is a perspective view of one of many embodiments of a panel subassembly of an electronic equipment enclosure according to the disclosure.
Figure 7:
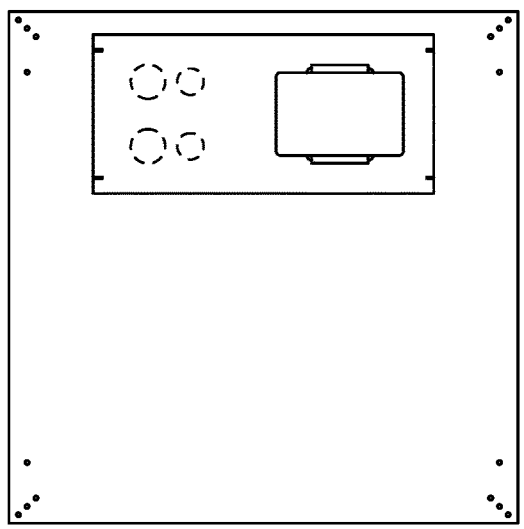
FIG. 7 is a plan view of one of many embodiments of a panel of an electronic equipment enclosure according to the disclosure.
Figure 8:
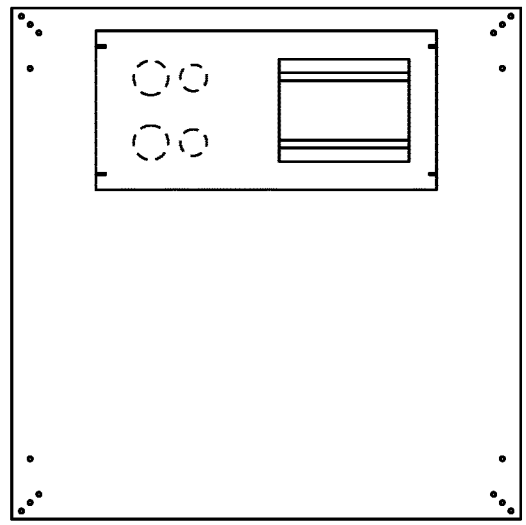
FIG. 8 is a plan view of another one of many embodiments of a panel of an electronic equipment enclosure according to the disclosure.
Figure 9:
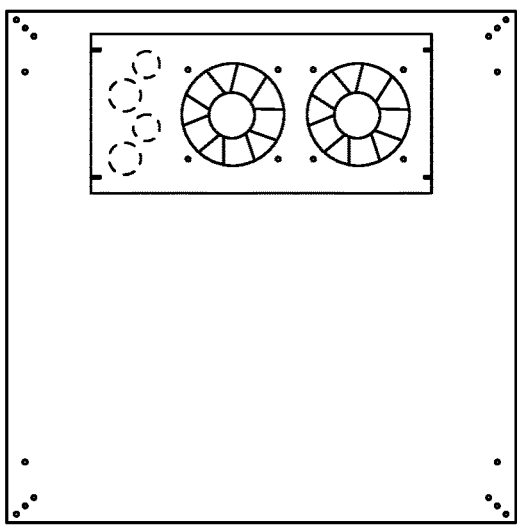
FIG. 9 is a plan view of still another one of many embodiments of a panel of an electronic equipment enclosure according to the disclosure.
Figure 10:
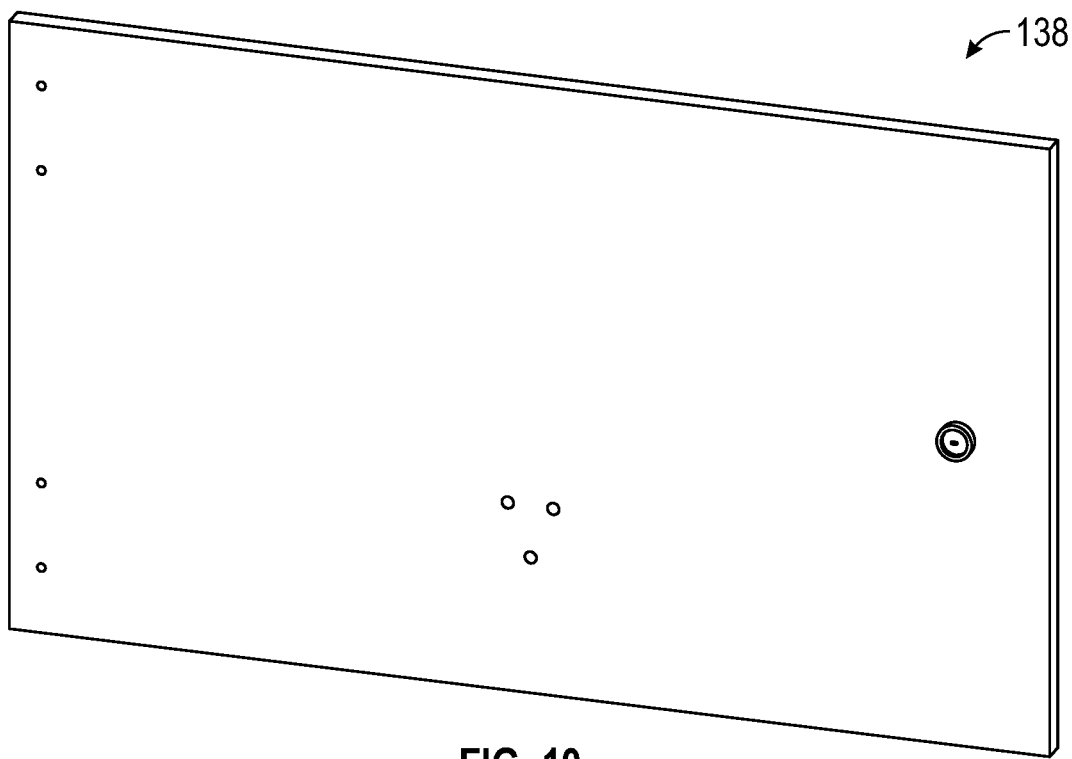
FIG. 10 is a perspective view of one of many embodiments of a door panel of an electronic equipment enclosure according to the disclosure.
Figure 11:
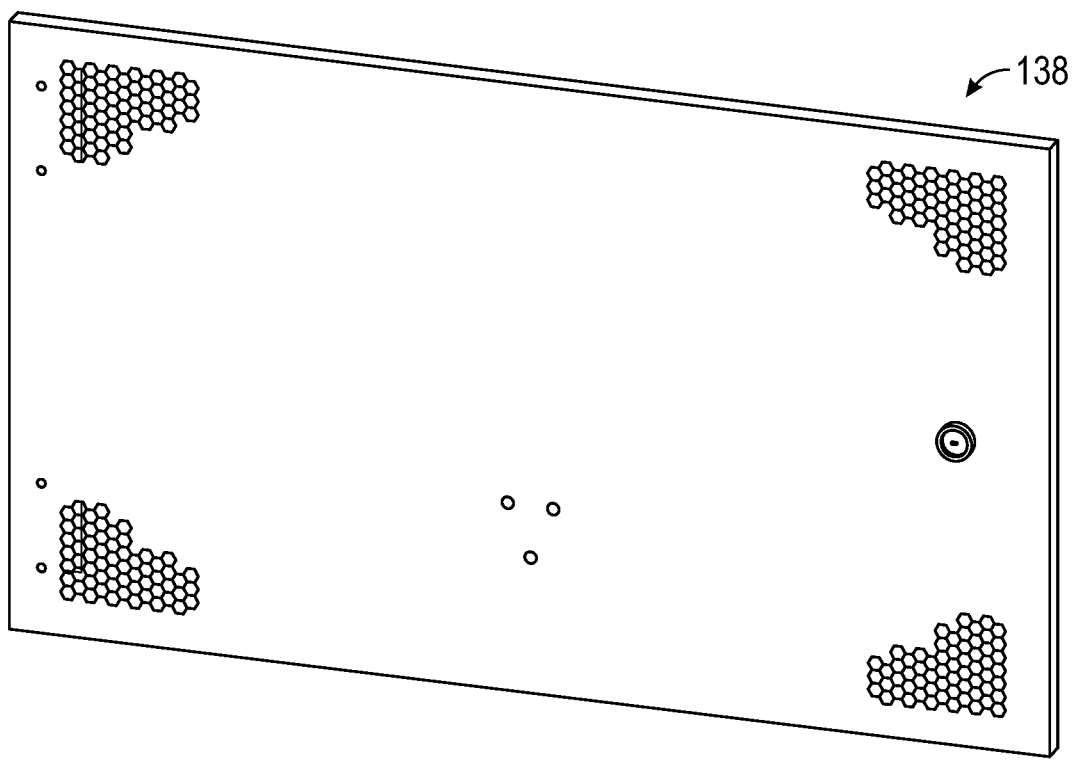
FIG. 11 is a perspective view of another one of many embodiments of a panel of an electronic equipment enclosure according to the disclosure.
Figure 12A:
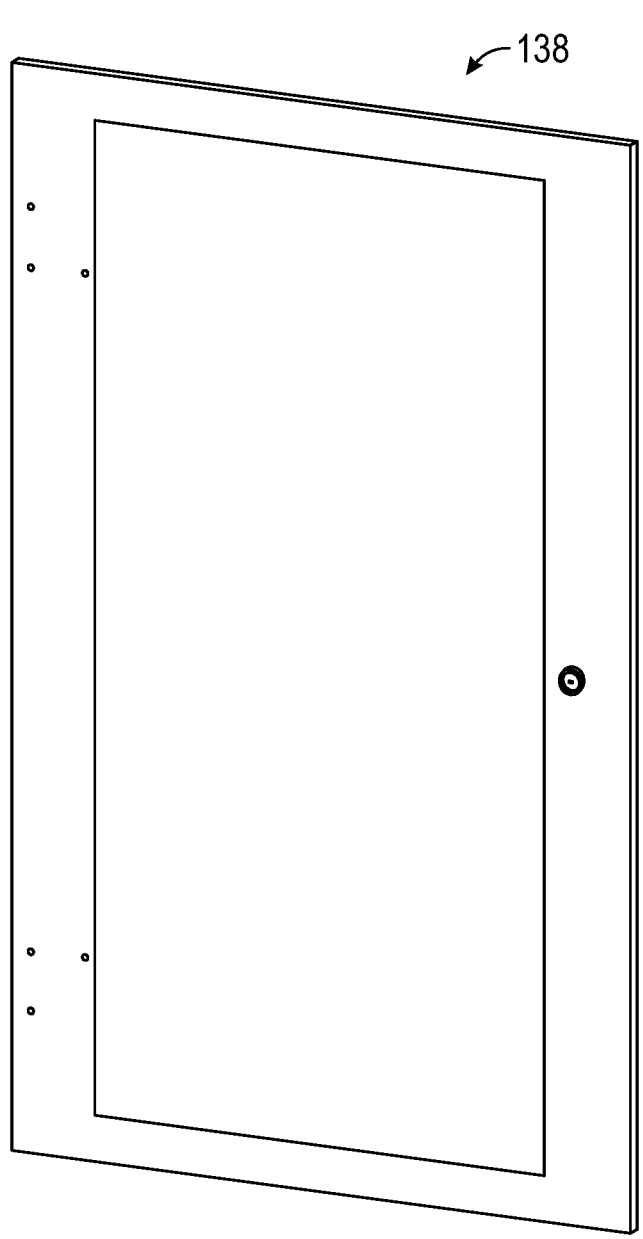
FIG. 12A is a perspective view of still another one of many embodiments of a panel of an electronic equipment enclosure according to the disclosure.
Figure 12B:
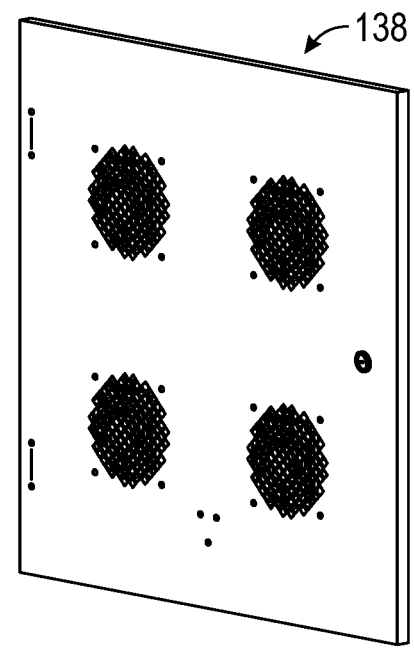
FIG. 12B is a perspective view of still another one of many embodiments of a panel of an electronic equipment enclosure according to the disclosure.
Figure 12C:
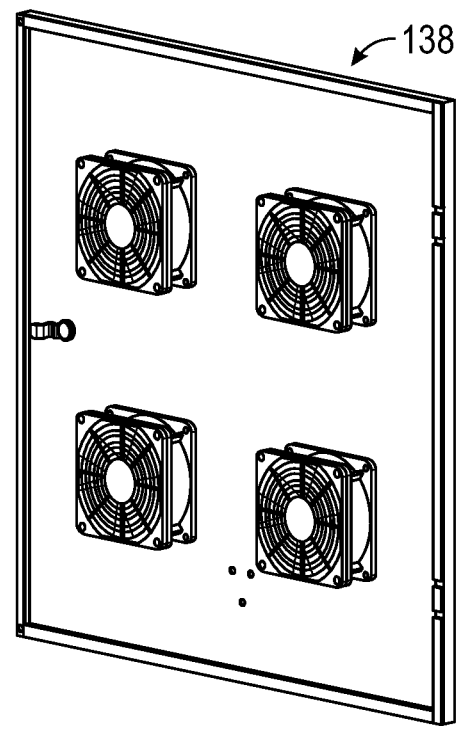
FIG. 12C is a perspective view of still another one of many embodiments of a panel of an electronic equipment enclosure according to the disclosure.
Figure 13:
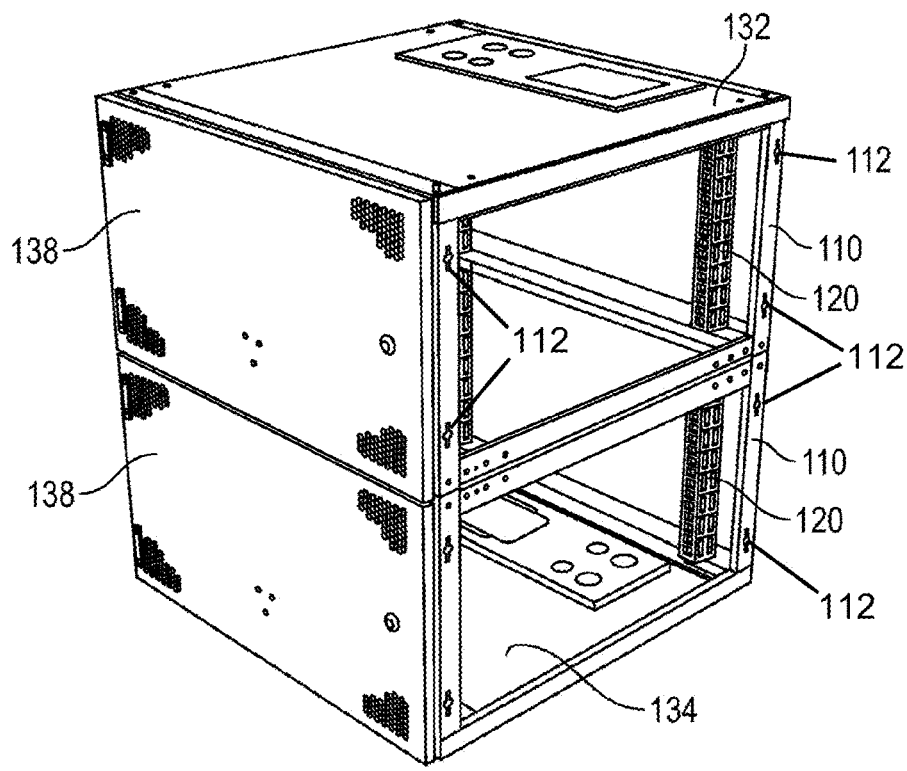
FIG. 13 is a first perspective view of one of many embodiments of a dual electronic equipment enclosure according to the disclosure.
Figure 14:
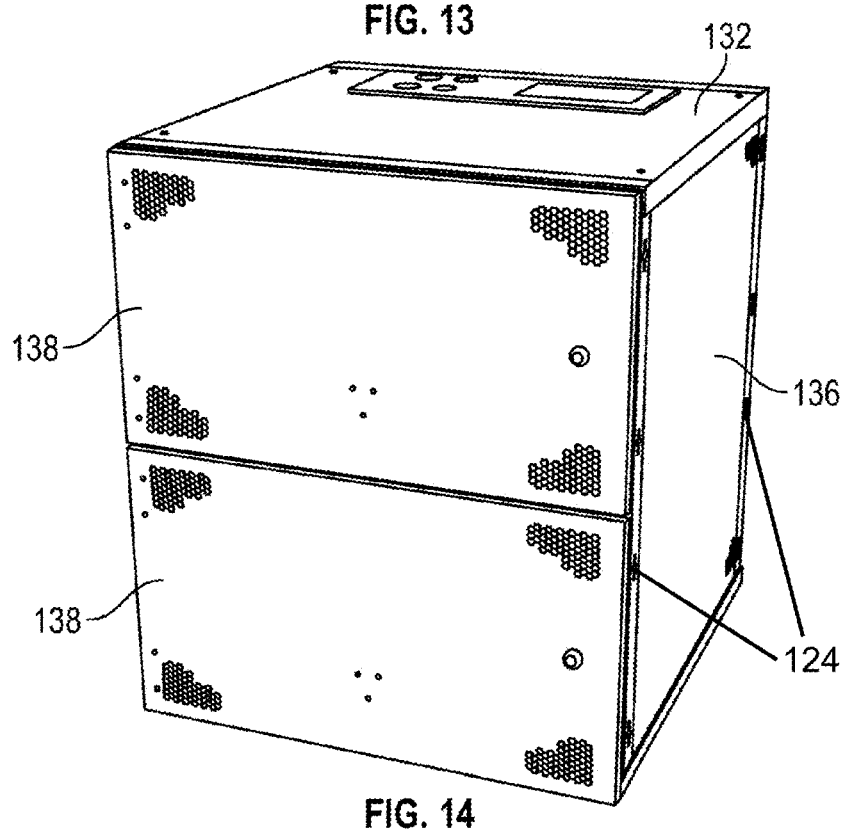
FIG. 14 is a second perspective view of one of many embodiments of a dual electronic equipment enclosure according to the disclosure.
Figure 15A:
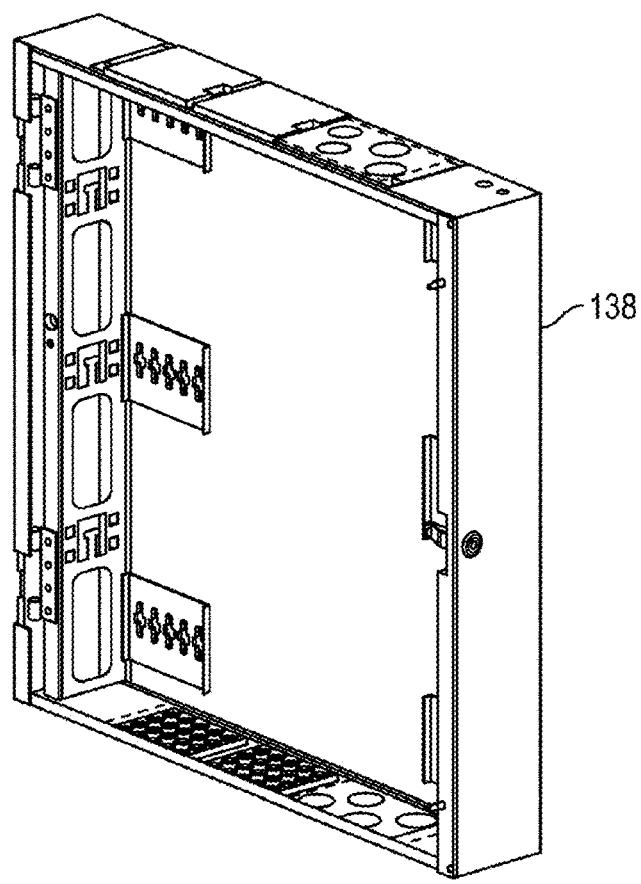
FIG. 15A is a perspective view of one of many embodiments of a rear door assembly for an electronic equipment enclosure according to the disclosure.
Figure 15B:
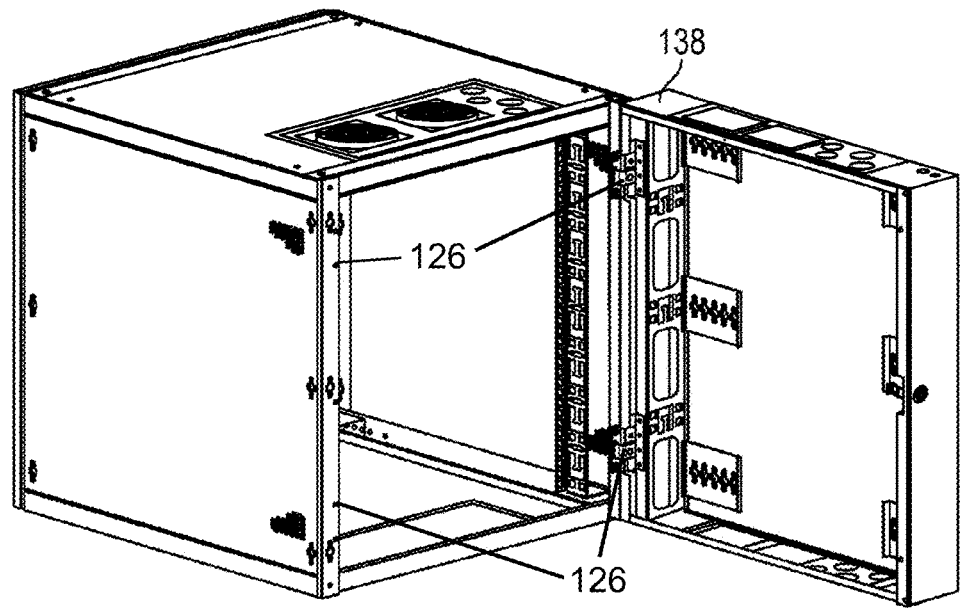
FIG. 15B is a perspective view of one of many embodiments of an electronic equipment enclosure supported by the rear door of FIG. 15A according to the disclosure.
Figure 15C:
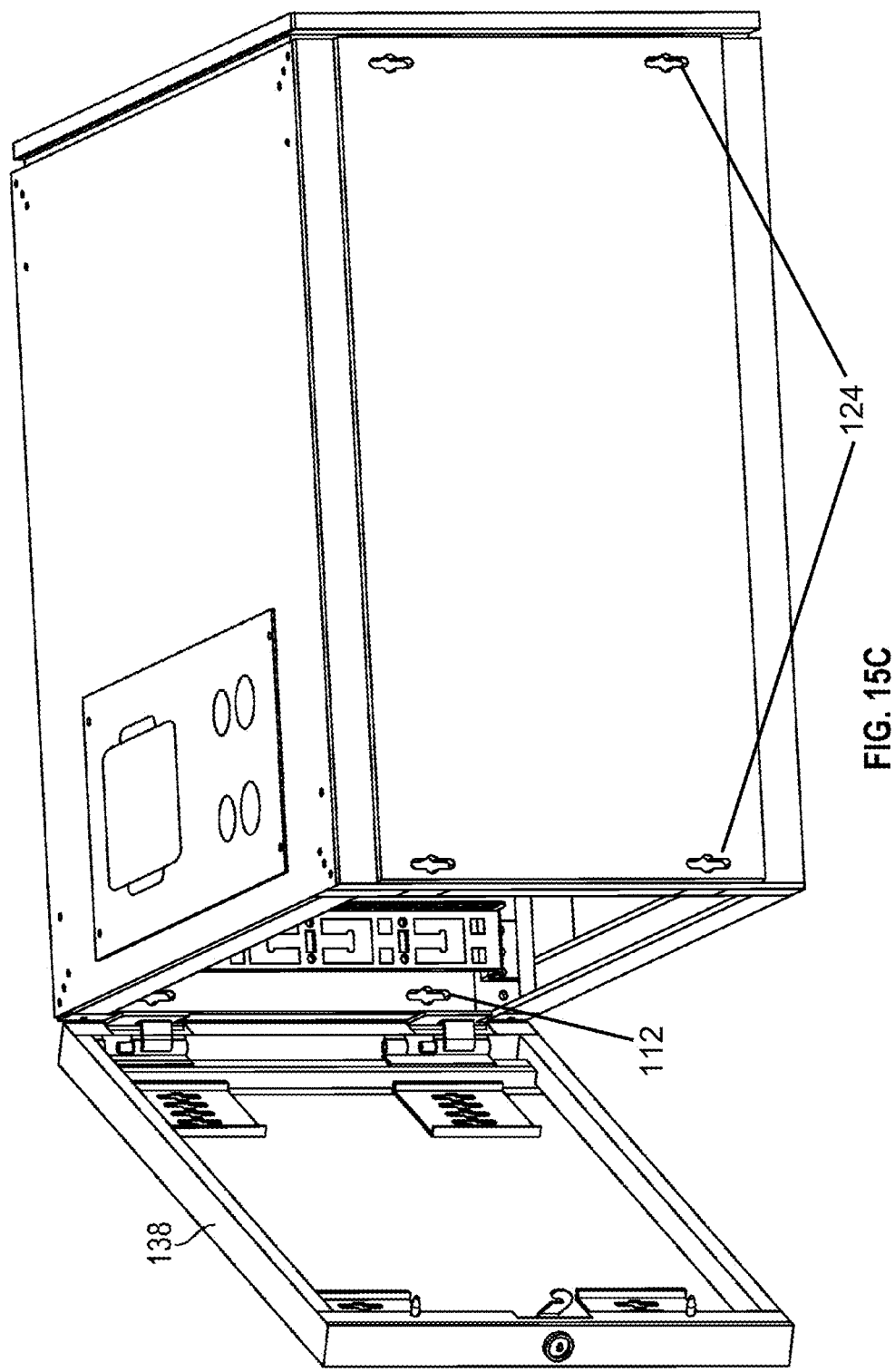
FIG. 15C is a perspective view of one of many embodiments of an electronic equipment enclosure supported by an alternative rear door according to the disclosure.
Figure 16:
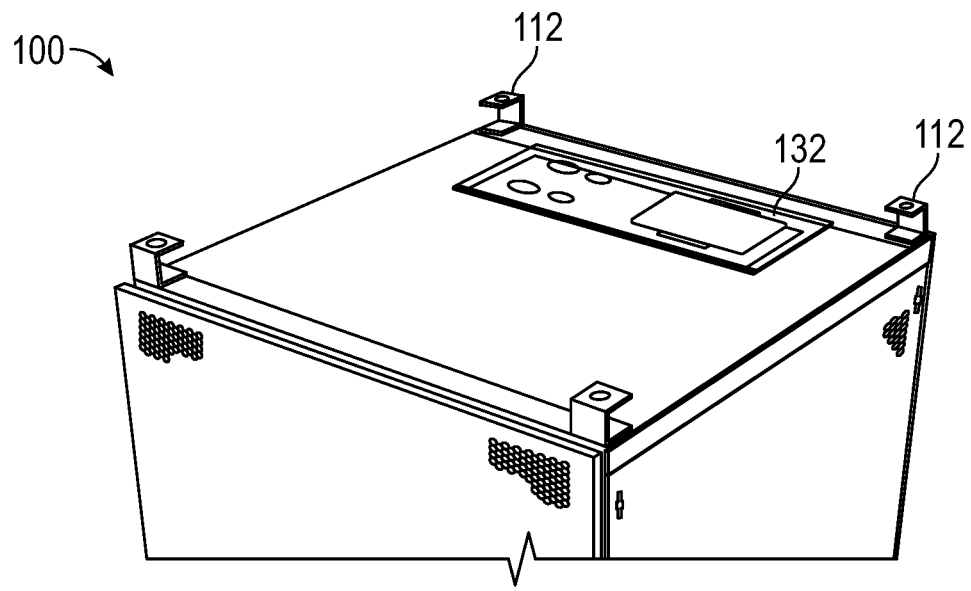
FIG. 16 is a first perspective view of one of many embodiments of a top mount for an electronic equipment enclosure according to the disclosure.
Figure 17:
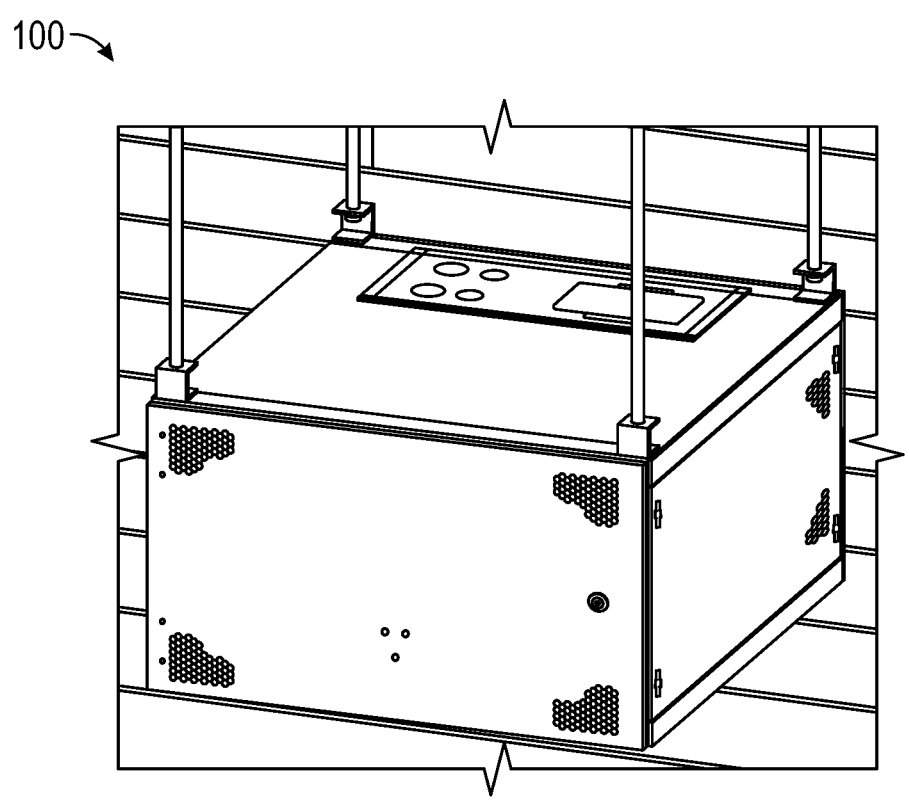
FIG. 17 is a first perspective view of one of many embodiments of a top mount for an electronic equipment enclosure according to the disclosure.
Figure 18:
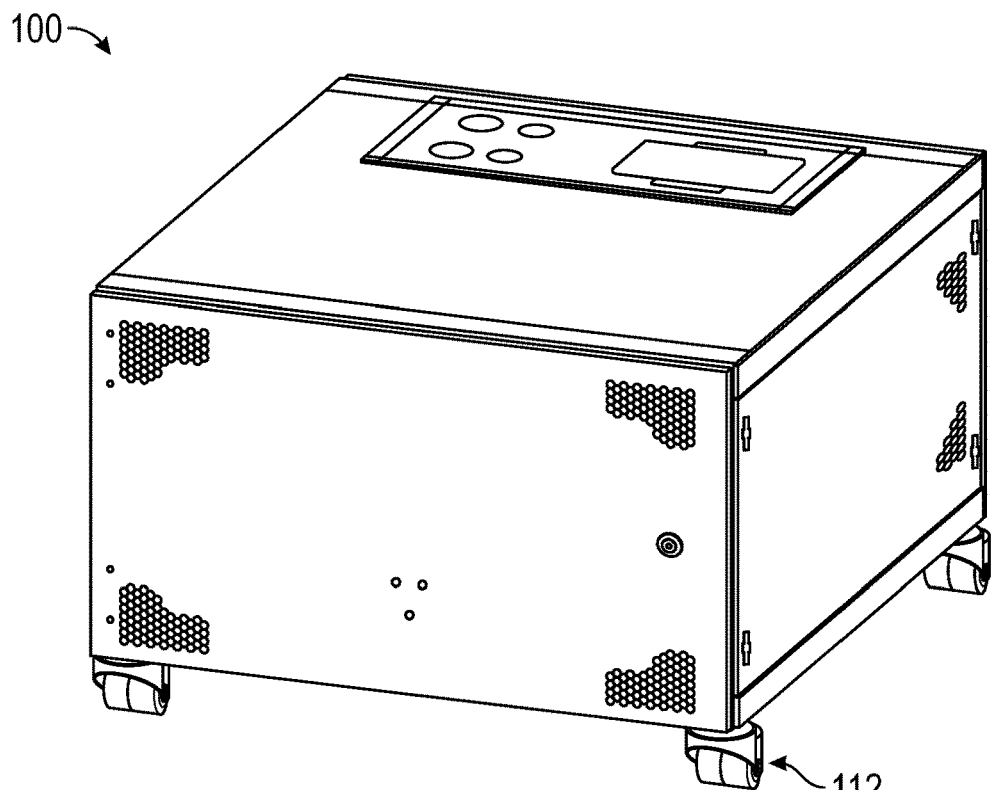
FIG. 18 is a perspective view of one of many embodiments of a bottom mount for an electronic equipment enclosure according to the disclosure.
Figure 19:
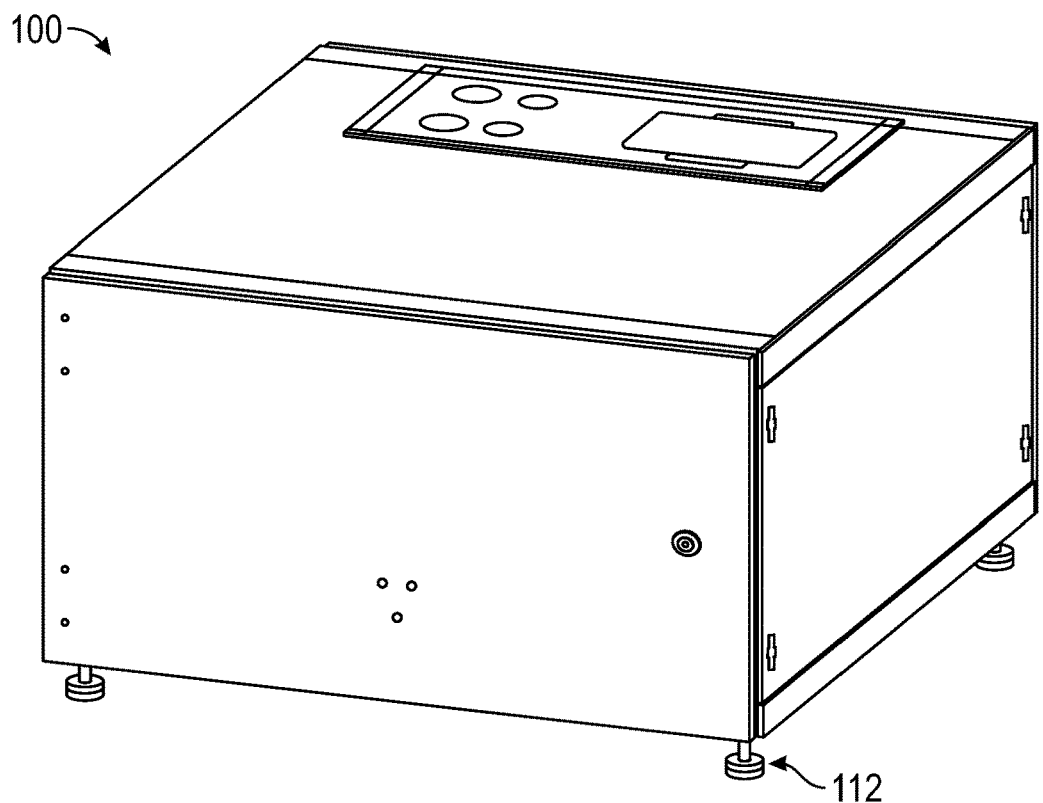
FIG. 19 is a perspective view of another one of many embodiments of a bottom mount for an electronic equipment enclosure according to the disclosure.
Figure 20:
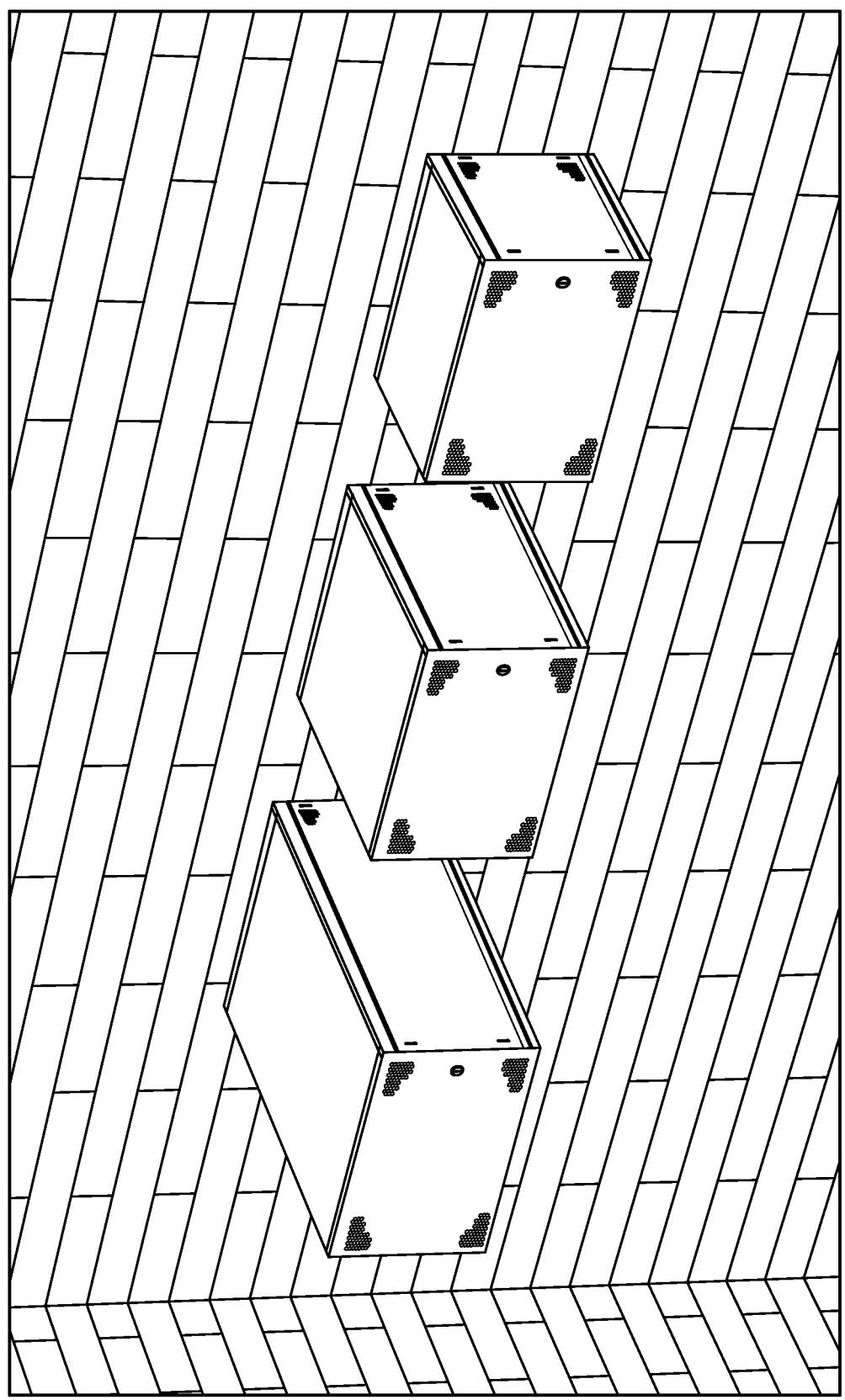
FIG. 20 is a perspective view of a collection of several embodiments of an electronic equipment enclosure according to the disclosure.
Figure 21:
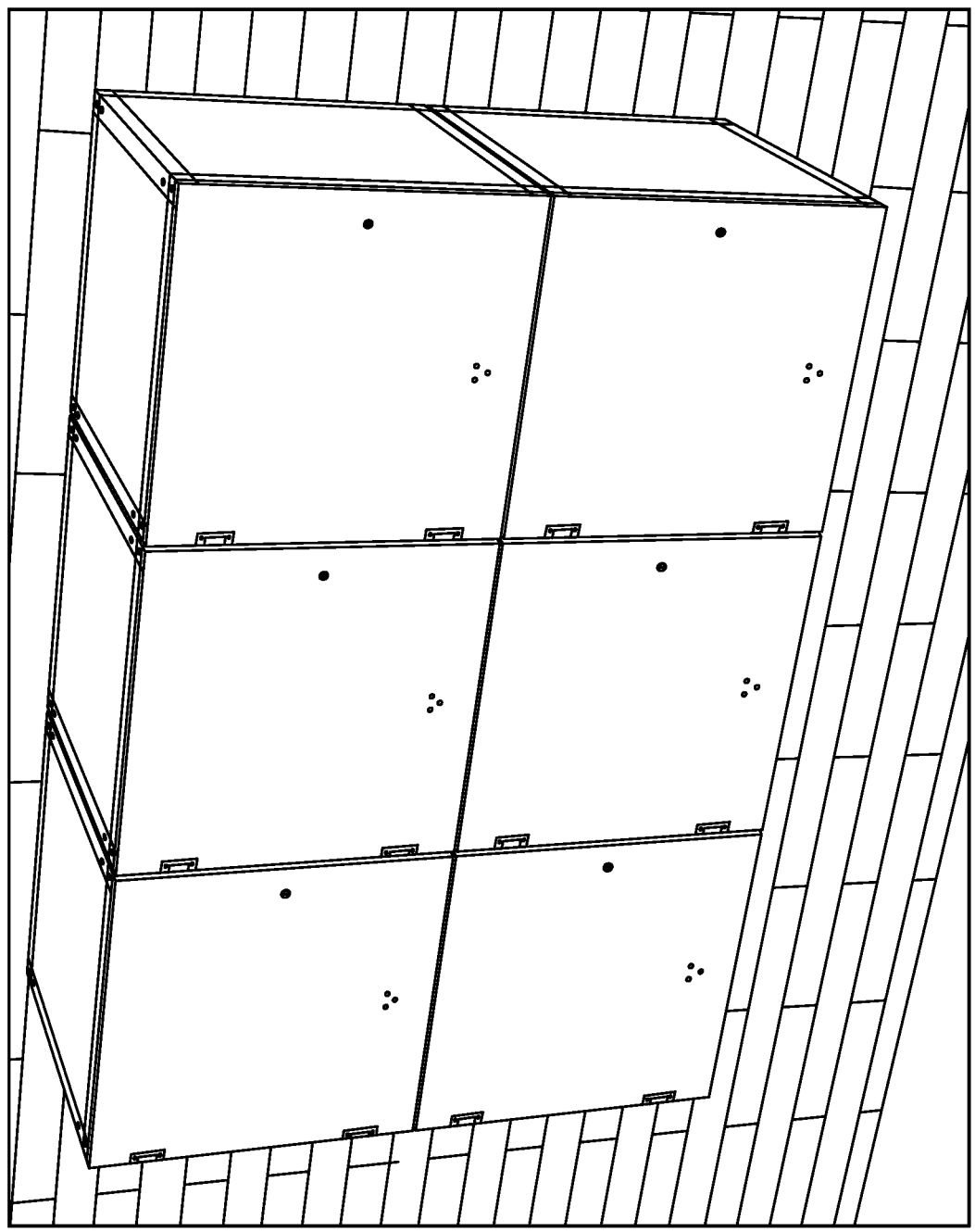
FIG. 21 is a perspective view of one of many embodiments of a multi-enclosure assembly of an electronic equipment enclosures according to the disclosure.
Figure 22:
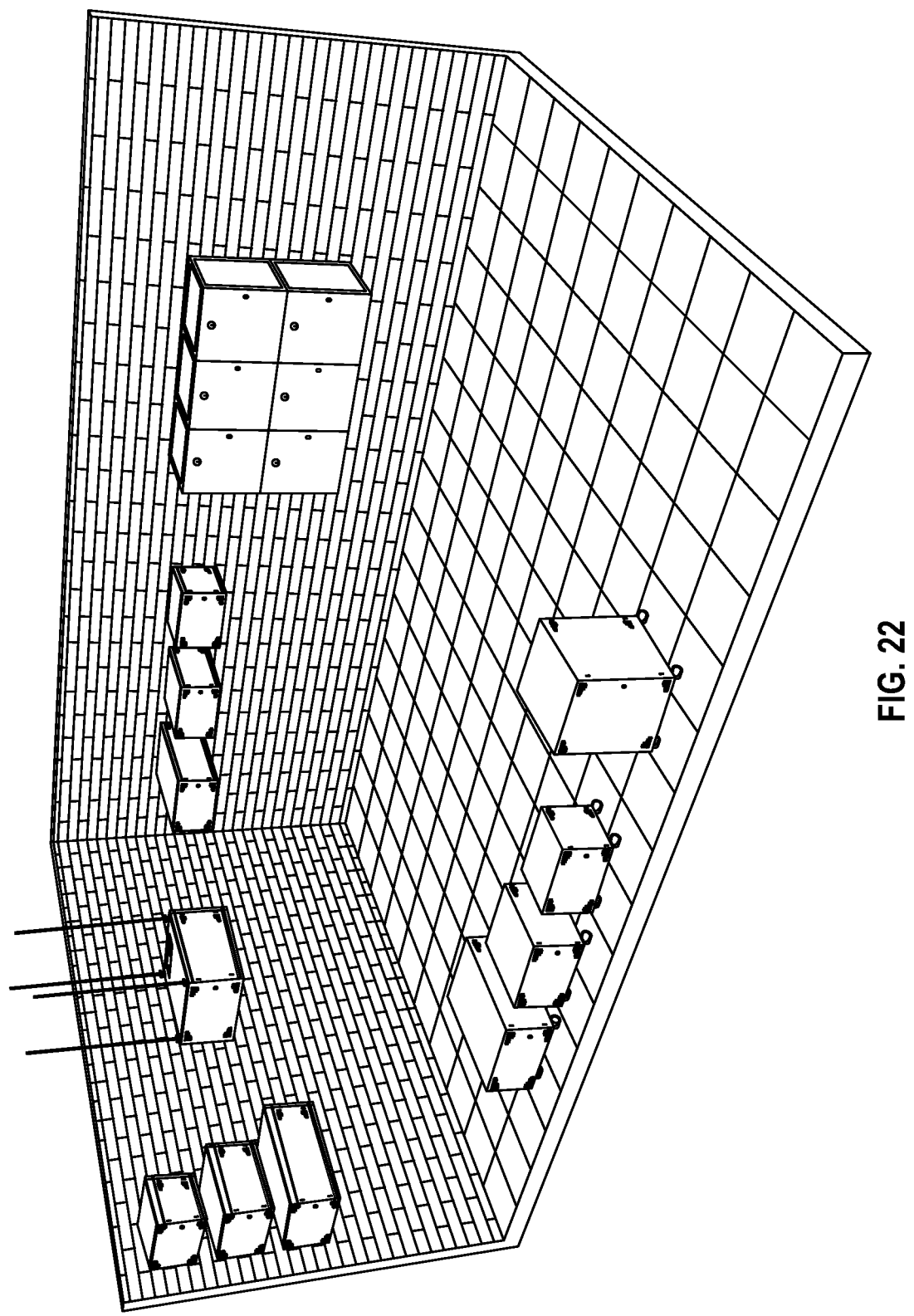
FIG. 22 is a perspective view of a collection of several embodiments of electronic equipment enclosures according to the disclosure.
Figure 23:
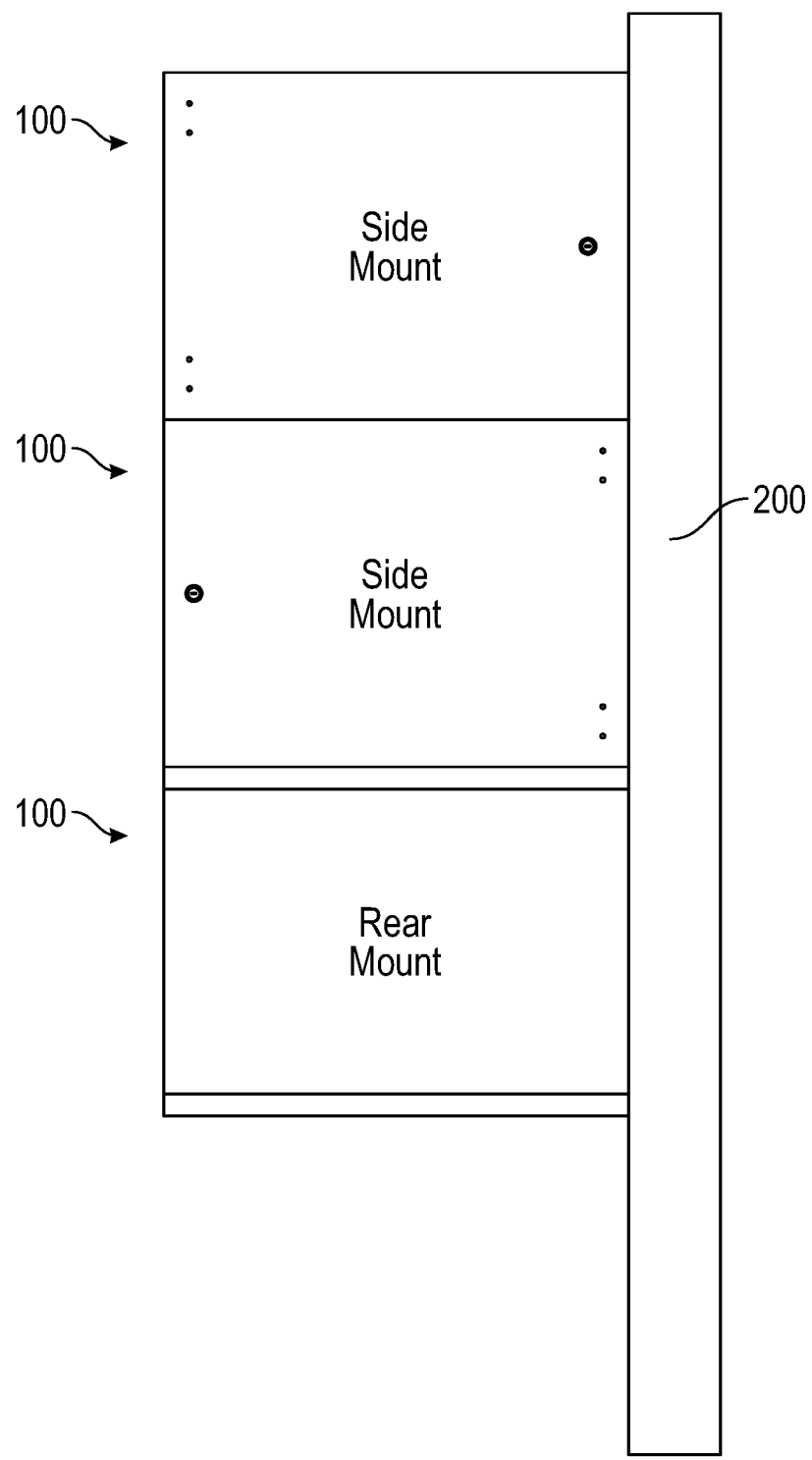
FIG. 23 is an elevation view of a collection of several embodiments of electronic equipment enclosures according to the disclosure.
Figure 24A:
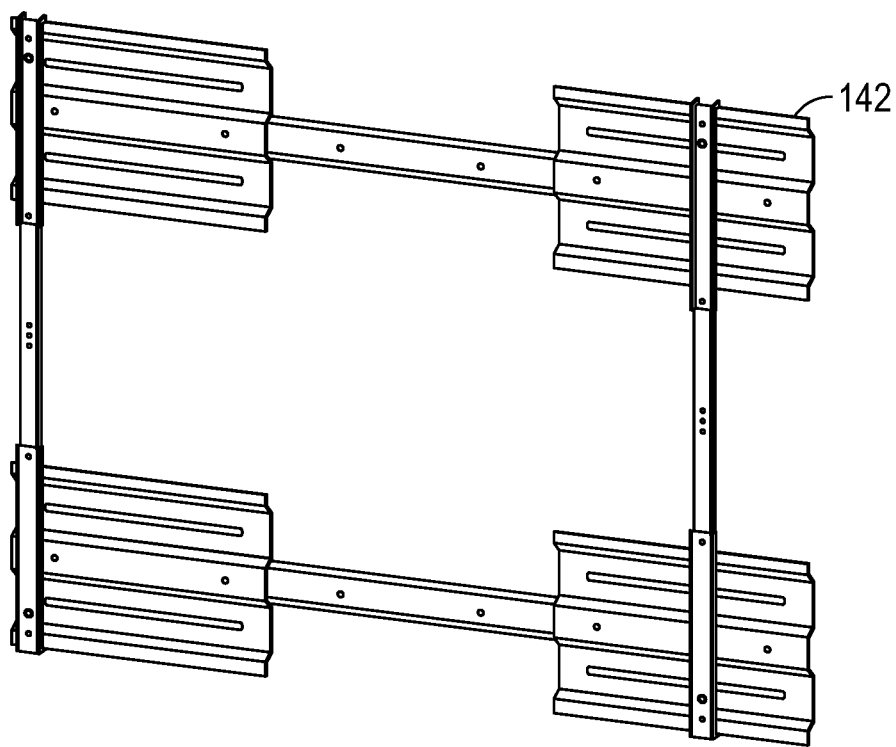
FIG. 24A is a perspective view of a side mounting bracket for an electronic equipment enclosure according to the disclosure.
Figure 24B:
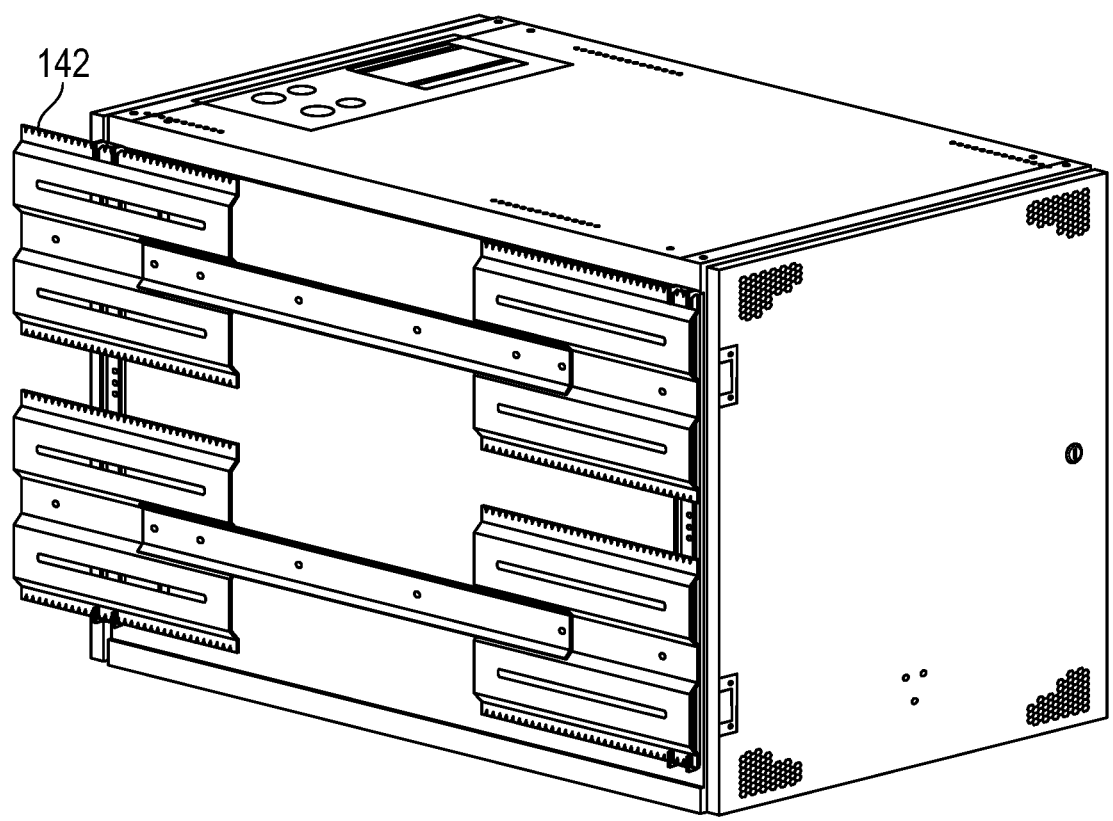
FIG. 24B is a perspective view of a side mounting bracket secured to an electronic equipment enclosure according to the disclosure.

FIG. 1 is a front perspective view of one of many embodiments of an electronic equipment enclosure according to the disclosure. FIG. 2 is a rear perspective view of one of many embodiments of an electronic equipment enclosure according to the disclosure. FIG. 3 is an exploded perspective view of one of many embodiments of a frame subassembly of an electronic equipment enclosure according to the disclosure. FIG. 4 is a perspective view of one of many embodiments of a frame subassembly of an electronic equipment enclosure according to the disclosure. FIG. 5 is an exploded perspective view of one of many embodiments of a panel subassembly of an electronic equipment enclosure according to the disclosure. FIG. 6 is a perspective view of one of many embodiments of a panel subassembly of an electronic equipment enclosure according to the disclosure. FIG. 7 is a plan view of one of many embodiments of a panel of an electronic equipment enclosure according to the disclosure. FIG. 8 is a plan view of another one of many embodiments of a panel of an electronic equipment enclosure according to the disclosure. FIG. 9 is a plan view of still another one of many embodiments of a panel of an electronic equipment enclosure according to the disclosure. FIG. 10 is a perspective view of one of many embodiments of a door panel of an electronic equipment enclosure according to the disclosure. FIG. 11 is a perspective view of another one of many embodiments of a panel of an electronic equipment enclosure according to the disclosure. FIG. 12A is a perspective view of still another one of many embodiments of a panel of an electronic equipment enclosure according to the disclosure. FIG. 12B is a perspective view of still another one of many embodiments of a panel of an electronic equipment enclosure according to the disclosure. FIG. 12C is a perspective view of still another one of many embodiments of a panel of an electronic equipment enclosure according to the disclosure. FIG. 13 is a first perspective view of one of many embodiments of a dual electronic equipment enclosure according to the disclosure. FIG. 14 is a second perspective view of one of many embodiments of a dual electronic equipment enclosure according to the disclosure. FIG. 15A is a perspective view of one of many embodiments of a rear door assembly for an electronic equipment enclosure according to the disclosure. FIG. 15B is a perspective view of one of many embodiments of an electronic equipment enclosure supported by the rear door of FIG. 15A according to the disclosure. FIG. 15C is a perspective view of one of many embodiments of an electronic equipment enclosure supported by an alternative rear door according to the disclosure. FIG. 16 is a first perspective view of one of many embodiments of a top mount for an electronic equipment enclosure according to the disclosure. FIG. 17 is a first perspective view of one of many embodiments of a top mount for an electronic equipment enclosure according to the disclosure. FIG. 18 is a perspective view of one of many embodiments of a bottom mount for an electronic equipment enclosure according to the disclosure. FIG. 19 is a perspective view of another one of many embodiments of a bottom mount for an electronic equipment enclosure according to the disclosure. FIG. 20 is a perspective view of a collection of several embodiments of an electronic equipment enclosure according to the disclosure. FIG. 21 is a perspective view of one of many embodiments of a multi-enclosure assembly of an electronic equipment enclosures according to the disclosure. FIG. 22 is a perspective view of a collection of several embodiments of electronic equipment enclosures according to the disclosure. FIG. 23 is an elevation view of a collection of several embodiments of electronic equipment enclosures according to the disclosure. FIG. 24A is a perspective view of a side mounting bracket for an electronic equipment enclosure according to the disclosure. FIG. 24B is a perspective view of a side mounting bracket secured to an electronic equipment enclosure according to the disclosure. FIGS. 1-24B are described in conjunction with one another.

In at least one embodiment, an electronic equipment enclosure 100 can include a frame assembly 110, a rack assembly 120 mounted within the frame assembly 110, a panel assembly 130 mounted on the frame assembly 110, and a utility space 140 to contain a power unit, such as an uninterruptible power supply (UPS) or a power distribution unit (PDU) therein. In at least one embodiment, the frame assembly 110 can define a top, a bottom, two sides, a front, and a rear thereof. In at least one embodiment, the rack assembly 120 can define a rack volume therewithin. In at least one embodiment, the rack assembly 120 comprises four identical equipment rails 122 and can be configured to hold IT equipment such as switches, servers, etc., or other equipment. In at least one embodiment, the panel assembly 130 can include a top panel 132, a bottom panel 134, one or more side panels 136, and one or more opening doors 138. In at least one embodiment, the utility space 140 can be defined by the frame assembly 110 between the panel assembly 130 and the rack volume such that the power unit does not extend beyond the panel assembly 130 or into the rack volume.

In at least one embodiment, each side of the frame assembly 110 can include one or more mounts 112 configured to allow the enclosure 100 to be mounted to a wall 200 along either, or both, of the sides. In at least one embodiment, the top of the frame assembly 110 can include one or more mounts 112 configured to allow the enclosure 100 to be mounted overhead, such as to or near a ceiling. In at least one embodiment, the bottom of the frame assembly 110 can include one or more mounts 112 configured to allow the enclosure 100 to be mounted to or otherwise supported on a floor or other structure beneath the enclosure.

In at least one embodiment, the frame assembly 110 comprises four identical vertical posts 114, four identical lateral horizontal rails 116, and four identical longitudinal horizontal rails 118. In at least one embodiment, each of the four identical vertical posts 114 of the frame assembly 110 can include one or more hinge mounting positions 126 configured to receive hinges of the door 138, such that the door 138 can be mounted to the front of the frame assembly 110 or the rear of the frame assembly 110, and such that the door 138 can be mounted to open toward a left side of the frame assembly 110 or a right side of the frame assembly 110. In at least one embodiment, frame assembly 110 can include posts 114, rails 116 and rails 118 as separate components (see, e.g., FIGS. 3-4) and such components can be coupled to one another to form all or part of frame assembly 110 in any manner required or desired in accordance with an implementation of the disclosure (e.g., by tongue and groove connections, mechanical fasteners such as bolts or screws, welding or other fastening means, separately or in combination). As another example, in at least one embodiment, two or more components of frame assembly 110 can be formed integrally with one another. For instance, as shown in FIGS. 5-6 for illustrative purposes, one or more posts 114, rails 116 and rails 118 can be formed from a single piece of material (e.g., sheet metal).

In at least one embodiment, the utility space 140 can exist next to the rack volume between the two vertical posts 114 and the two longitudinal horizontal rails 118 on each side of the frame assembly 110 between the equipment rails 122 and the side panel 136. In at least one embodiment, the utility space 140 can exist above the rack volume between the two lateral horizontal rails 116 and the two longitudinal horizontal rails 118 at the top of the frame assembly 110 between the equipment rails 122 and the top panel 132. In at least one embodiment, the utility space 140 can exist below the rack volume between the two lateral horizontal rails 116 and the two longitudinal horizontal rails 118 at the bottom of the frame assembly 110 between the equipment rails 122 and the bottom panel 134.

In at least one embodiment, the top panel 132 and the bottom panel 134 of the panel assembly 130 can be secured to the frame assembly 110 with a plurality of fasteners. In at least one embodiment, the top panel 132 and the bottom panel 134 can be interchangeable. In at least one embodiment, the top panel 132 and the bottom panel 134 can include one or more vents, such as louvered vents, one or more filters, one or more fans, one or more access panels, one or more knockouts, or any combination thereof.

In at least one embodiment, the side panel 136 can be held adjacent to the frame assembly 110 by the top panel 132 and the bottom panel 134, without fasteners. In at least one embodiment, the side panel 136 can also be held adjacent to the frame assembly 110 by the door 138, such that the side panel 136 can be removed from the enclosure 100 when the door 138 is open without tools. For example, the top panel 132 and the bottom panel 134 can include one or more lips that extend along the side of the frame assembly 110. In at least one embodiment, top and bottom edges of the side panels 136 can slide between the frame assembly 110 and the lips of the top panel 132 and the bottom panel 134.

In at least one embodiment, the doors 138 can prevent the side panels 136 from sliding, thereby holding the side panel 136 adjacent to the frame assembly 110. For example, the side panels 136 can include one or more lips that extend along the front or rear of the frame assembly 110, between the frame assembly 110 and the doors 138, such that the doors 138 hold the side panels 136 in place, when closed.

In at least one embodiment, the side panel 136 can cover the mounts 112 of the frame assembly 110. In at least one embodiment, the side panel 136 can include access cutouts 124 that provide access to the mounts 112 of the frame assembly 110. In at least one embodiment, the doors 138 can include one or more latches or locks that hold them closed. In at least one embodiment, the side panels 136 and/or the doors 138 can include one or more vents, such as louvered vents, one or more filters, one or more fans, one or more access panels, one or more windows, one or more knockouts, or any combination thereof.

In at least one embodiment, an electronic equipment enclosure can comprise a frame assembly 110, a rack assembly 120 mounted within the frame assembly 110, a panel assembly 130 mounted on the frame assembly. In at least one embodiment, each side of the frame assembly 110 can include one or more mounts configured to allow the enclosure to be mounted to a wall along both of the sides. In at least one embodiment, the top of the frame assembly 110 can include one or more mounts 112 configured to allow the enclosure to be mounted overhead. In at least one embodiment, the bottom of the frame assembly 110 can include one or more mounts 112, such as level adjustable feet or casters, configured to allow the enclosure 100 to be mounted to or otherwise supported on a floor or other structure beneath the enclosure.

In at least one embodiment, the frame assembly 110 can define a top, a bottom, two sides, a front, and a rear thereof. In at least one embodiment, the rack assembly 120 can define a rack volume therewithin. In at least one embodiment, the rack assembly 120 comprises four identical equipment rails 122. In at least one embodiment, the panel assembly 130 can include a top panel 132, a bottom panel 134, one or more side panels 136, and one or more opening doors 138.

In at least one embodiment, a utility space 140 can contain a power unit therein. In at least one embodiment, the utility space 140 can be defined by the frame assembly 110 between the panel assembly 130 and the rack volume such that the power unit does not extend beyond the panel assembly 130 or into the rack volume.

In at least one embodiment, the frame assembly 110 comprises four identical vertical posts 114, four identical lateral horizontal rails 116, and four identical longitudinal horizontal rails 118. In at least one embodiment, each of the four identical vertical posts 114 of the frame assembly 110 can include one or more hinge mounting positions 126 configured to receive hinges of the door 138, such that the door 138 can be mounted to the front of the frame assembly 110 or the rear of the frame assembly, and such that the door 138 can be mounted to open toward a left side of the frame assembly 110 or a right side of the frame assembly 110.

In at least one embodiment, the top panel 132 and the bottom panel 134 can be secured to the frame assembly 110 with a plurality of fasteners. In at least one embodiment, the side panel 136 can be held adjacent to the frame assembly 110 by the top panel 132 and the bottom panel 134, without fasteners. In at least one embodiment, the side panel 136 can also be held adjacent to the frame assembly 110 by the door 138, such that the side panel 136 can be removed from the enclosure 100 when the door 138 is open without tools.

In at least one embodiment, two or more frame assembles 110 can be secured together, such as shown in FIGS. 13, 14, 21, 22, and 23. In at least one embodiment, two or more enclosures 100 can share a top panel 132, a bottom panel 134, a side panel 136, a door 138, or any combination thereof. In at least one embodiment, two or more enclosures 100 can be secured together and each have independent top panels 132, bottom panels 134, side panels 136, doors 138, or any combination thereof. In at least one embodiment, two or more enclosures 100 can be secured together and have a variety of shared and independent top panels 132, bottom panels 134, side panels 136, doors 138, or any combination thereof. In this manner, two or more enclosures 100 can be mounted as an array with the ability to pass cables between them.

The enclosures 100 of the present invention can be mounted to a wall 200 by a rear panel or rear door 138, thereby allowing the enclosure 100 to swing open allowing access to the rear of equipment mounted therein. As shown in FIG. 15A and FIG. 15B, for example, the rear door 138 may include one or more vents, such as louvered vents, one or more filters, one or more fans, one or more access panels, one or more knockouts, or any combination thereof. Embodiments of the present disclosure can include cable access and routing features configured to make enclosures 100 more convenient and user friendly than conventional enclosures in accordance with a particular physical implementation of the present disclosure. In at least one embodiment, two or more access panels, such as the access panels shown on the top and bottom surfaces or walls in the exemplary embodiments of FIGS. 15A-15C, can have the same or similar arrangements of available cable pass-through choices, such as knock-outs, removeable plastic covers, brushes and other cable routing structure, whether separately or in any combination with one another.

The enclosures 100 of the present invention can be mounted to the wall 200 directly using the mounts 112, or indirectly using additional brackets, on the rear of the frame assembly 110 or on either side of the frame assembly 110. For example, the enclosures 100 of the present invention can be mounted to the wall 200 indirectly using a hinged bracket on the rear of the frame assembly 110. In at least one embodiment, the enclosures 100 of the present invention can be mounted to the wall 200 using the mounts 112 on the rear of the frame assembly 110. In at least one embodiment, the enclosures 100 of the present invention can be mounted to the wall 200 using a hinged door 138 on the rear of the frame assembly 110, as a hinged bracket. In at least one embodiment, the enclosures 100 of the present disclosure can be mounted to the wall 200 using a side mount bracket 142, such as that shown in FIG. 24A and FIG. 24B for illustrative purposes. In at least one embodiment, bracket 142 can be or include an adjustable bracket or bracket system for facilitating mounting a rack to the wall while ensuring that, if mounted to a stud wall, studs indeed can be used to support the load of the rack. In at least one embodiment, one or more brackets 142 can be configured to mount, for example, to the side or rear of the rack (or both).

The enclosures 100 of the present invention can be manufactured in a variety of depths, such as providing 400 mm, 600 mm, or 900 mm deep rack volumes, to accommodate a variety of equipment mounted therein and/or provide cabling space around the equipment mounted therein. The enclosures 100 of the present invention can include one or more solid doors 138, perforated or ventilated doors 138, transparent doors 138 or combinations thereof.

Other and further embodiments utilizing one or more aspects of the disclosure can be devised without departing from the spirit of Applicants' disclosure. For example, the devices, systems and methods can be implemented for enclosures of numerous different types and sizes in numerous different industries. Further, the various methods and embodiments of the devices, systems and methods can be included in combination with each other to produce variations of the disclosed methods and embodiments. Discussion of singular elements can include plural elements and vice-versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicants, but rather, in conformity with the patent laws, Applicants intend to fully protect all such modifications and improvements that come within the scope or range of equivalents of the following claims.

What is claimed is:

1. An electronic equipment enclosure, comprising:
   a frame assembly, the frame assembly defining a top, a bottom, two sides, a front, and a rear thereof;
   a rack assembly mounted within the frame assembly, the rack assembly defining a rack volume therewithin;
   a panel assembly mounted on the frame assembly, the panel assembly including a top panel, a bottom panel, a side panel, and at least one door, wherein the top panel and the bottom panel are secured to the frame assembly with a plurality of fasteners and the side panel is held adjacent to the frame assembly by the top panel and the bottom panel; and
   a utility space defined by the frame assembly between the panel assembly and the rack volume;
   wherein each side of the frame assembly includes one or more mounts configured to allow the enclosure to be cantilever mounted to a wall along both of the sides, wherein the top of the frame assembly includes one or more mounts configured to allow the enclosure to be mounted overhead, and wherein the bottom of the frame assembly includes one or more mounts configured to allow the enclosure to be supported from beneath; and
   wherein the frame assembly comprises four identical vertical posts, four identical lateral horizontal rails, and four identical longitudinal horizontal rails.

2. The enclosure of claim 1, wherein each of the four identical vertical posts of the frame assembly include at least two hinge mounting positions configured to receive hinges of the door, such that the door can be mounted to the front of the frame assembly and the door can be mounted to the rear of the frame assembly, and such that the door can be mounted to open toward a left side of the frame assembly and the door can be mounted to open toward a right side of the frame assembly.

3. The enclosure of claim 1, wherein the side panel is also held adjacent to the frame assembly by the door, and wherein the side panel is configured for toolless removal from the enclosure when the door is open.

4. The enclosure of claim 1, wherein the side panel is slideably disposed relative to the frame assembly and configured to be selectively and slideably removable when the door is open to provide access to at least a portion of one of the two sides of the frame assembly.

5. An electronic equipment enclosure, comprising:
   a frame assembly, the frame assembly defining a top, a bottom, two sides, a front, and a rear thereof;
   a rack assembly mounted within the frame assembly, the rack assembly defining a rack volume therewithin;
   a panel assembly mounted on the frame assembly, the panel assembly including a top panel, a bottom panel, a side panel, and at least one door, wherein the top panel and the bottom panel are secured to the frame assembly with a plurality of fasteners and the side panel is held adjacent to the frame assembly by the top panel and the bottom panel; and
   a utility space defined by the frame assembly between the panel assembly and the rack volume.

6. The enclosure of claim 5, wherein the side panel is also held adjacent to the frame assembly by the door, and wherein the side panel is configured for toolless removal from the enclosure when the door is open.

7. The enclosure of claim 5, wherein at least one of the sides of the frame assembly includes one or more mounts configured to allow the enclosure to be mounted to a wall along the at least one of the sides.

8. The enclosure of claim 5, wherein the top of the frame assembly includes one or more mounts configured to allow the enclosure to be mounted to a ceiling.

9. The enclosure of claim 5, wherein the bottom of the frame assembly includes one or more mounts configured to allow the enclosure to be mounted to a floor.

10. The enclosure of claim 5, wherein each side of the frame assembly includes one or more mounts configured to allow the enclosure to be mounted to a wall along both of the sides, wherein the top of the frame assembly includes one or more mounts configured to allow the enclosure to be mounted to a ceiling, and wherein the bottom of the frame assembly includes one or more mounts configured to allow the enclosure to be mounted to a floor.

11. The enclosure of claim 5, wherein the frame assembly comprises four identical vertical posts, four identical lateral horizontal rails, and four identical longitudinal horizontal rails.

12. The enclosure of claim 11, wherein each of the four identical vertical posts of the frame assembly include at least two hinge mounting positions configured to receive hinges of the door, such that the door can be mounted to the front of the frame assembly and the door can be mounted to the rear of the frame assembly, and such that the door can be mounted to open toward a left side of the frame assembly and the door can be mounted to open toward a right side of the frame assembly.

13. The enclosure of claim 5, wherein the rack assembly comprises four identical equipment rails.

14. An electronic equipment enclosure, comprising:
a frame assembly, the frame assembly defining a top, a bottom, two sides, a front, and a rear thereof;
a rack assembly mounted within the frame assembly, the rack assembly defining a rack volume therewithin; and
a panel assembly mounted on the frame assembly, the panel assembly including a top panel, a bottom panel, a side panel, and at least one door;
wherein each side of the frame assembly includes one or more mounts configured to allow the enclosure to be mounted to a wall along both of the sides, wherein the top of the frame assembly includes one or more mounts configured to allow the enclosure to be mounted overhead, and wherein the bottom of the frame assembly includes one or more mounts configured to allow the enclosure to be supported from beneath;
wherein the frame assembly comprises four vertical posts;
wherein the one or more mounts configured to allow the enclosure to be mounted to a wall comprise one or more openings disposed through each of the four vertical posts; and
wherein the side panel comprises access cutouts that provide access to the one or more openings of two of the four vertical posts.

15. The enclosure of claim 14, wherein the top panel and the bottom panel are secured to the frame assembly with a plurality of fasteners and the side panel is held adjacent to the frame assembly by the top panel and the bottom panel.

16. The enclosure of claim 15, wherein the side panel is also held adjacent to the frame assembly by the door, and wherein the side panel is configured for toolless removal from the enclosure when the door is open.

17. The enclosure of claim 14, further including a utility space defined by the frame assembly between the panel assembly and the rack volume.

18. The enclosure of claim 14, wherein the four vertical posts are identical, and wherein the frame assembly further comprises four identical lateral horizontal rails and four identical longitudinal horizontal rails.

19. The enclosure of claim 18, wherein each of the four identical vertical posts of the frame assembly include at least two hinge mounting positions configured to receive hinges of the door, such that the door can be mounted to the front of the frame assembly and the door can be mounted to the rear of the frame assembly, and such that the door can be mounted to open toward a left side of the frame assembly and the door can be mounted to open toward a right side of the frame assembly.

20. The enclosure of claim 14, wherein the rack assembly comprises four identical equipment rails.

* * * * *